United States Patent [19]
Allen et al.

[11] Patent Number: 5,304,539
[45] Date of Patent: Apr. 19, 1994

[54] METHOD FOR FABRICATING INTEGRATED MICROELECTRONIC ASSEMBLY COMPRISING PHOTOCONDUCTOR WITH OXIDE SUPERCONDUCTING LEADS

[75] Inventors: Silas J. Allen, Summit; Robert R. Krchnavek, Bridgewater, both of N.J.

[73] Assignee: Bell Communications Research, Inc., Livingston, N.J.

[21] Appl. No.: 881,841

[22] Filed: May 12, 1992

Related U.S. Application Data

[60] Division of Ser. No. 782,881, Oct. 17, 1991, Pat. No. 5,140,001, which is a continuation of Ser. No. 593,789, Oct. 5, 1990, abandoned.

[51] Int. Cl.$^5$ ............ B05D 5/06; B05D 5/12; H01L 39/12
[52] U.S. Cl. .................... 505/473; 505/701; 505/325; 505/480; 427/62; 427/63; 427/596; 257/35; 257/431; 257/661
[58] Field of Search ............ 505/1, 730, 701; 427/62, 63, 596, 595; 357/4, 5, 30; 257/35, 431, 661

[56] References Cited

U.S. PATENT DOCUMENTS

| | | | |
|---|---|---|---|
| 4,891,355 | 1/1990 | Hayashi et al. | 505/1 |
| 5,026,682 | 6/1991 | Clark et al. | 505/1 |
| 5,057,485 | 10/1991 | Nishino et al. | 505/1 |

OTHER PUBLICATIONS

Krchnavek et al, "Photoconductivity in oxygen-deficient bridge structures in superconducting $YBa_2Cu_3O_{7-x}$", ICEM 1990: 2nd international conference on electronic materials (Newark, N.J.) Sep. 17–19, 1990 pp. 135–140.

Krchnavek et al, "Photoresponse of laser modified high-Tc superconducting thin films", SPIE vol. 1187 Processing of Films for high Tc superconducting Electronics, Oct. 1989, pp. 261–269.

Primary Examiner—Roy King
Attorney, Agent, or Firm—Leonard Charles Suchyta; Loria B. Yeadon

[57] ABSTRACT

A beam (e.g. a focused laser beam) is utilized to irradiate the entire lateral width of a limited-extent portion of an elongated superconducting thin-film lead. The irradiated portion is converted to be non-superconducting and photoconductive. The converted portion constitutes a photodetector integrated with associated superconducting leads.

7 Claims, 1 Drawing Sheet

METHOD FOR FABRICATING INTEGRATED MICROELECTRONIC ASSEMBLY COMPRISING PHOTOCONDUCTOR WITH OXIDE SUPERCONDUCTING LEADS

This application is a division of Ser. No. 07/782,881, filed on Oct. 17, 1991, now U.S. Pat. No. 5,140,001 issued Aug. 18, 1992, which is a continuation of Ser. No. 07/593,789 filed on Oct. 5, 1990, now abandoned.

BACKGROUND OF THE INVENTION

This invention relates to superconducting materials and, more particularly, to microelectronic assemblies made from such materials.

The recent discovery of superconducting materials characterized by relatively high critical temperatures has spawned an extensive effort to understand and improve the materials. Moreover, considerable work has been done to begin processing the materials for eventual device fabrication.

One potentially promising area for superconductors is in the field of microelectronics. For this application, high-quality superconducting thin films on a variety of substrates have been demonstrated. However, useful application of these thin films requires subsequent processing to fabricate the various component structures required to form microelectronic assemblies.

Patterning a superconducting thin film to form leads that can serve as interconnects in an assembly has been accomplished. But little if any success has been reported heretofore on attempts to process the film to make additional components. If available, such components could be interconnected by patterned superconducting leads to form a microelectronic assembly.

Accordingly, considerable effort has been directed at trying to process a superconducting thin film to fabricate useful devices therein. It was recognized that this effort if successful had the potential for achieving integrated microelectronic assemblies in superconducting films.

SUMMARY OF THE INVENTION

In accordance with the principles of the present invention, a superconducting thin film is processed to form an integrated microelectronic assembly that comprises a photoconducting device having one or more superconducting leads connected thereto. In particular, the entire lateral widths of a limited portion of a superconducting thin-film lead is irradiated to render the portion non-superconducting and semiconducting and capable of generating charge carriers in response to incident light.

In accordance with a more specific feature of the invention, a focused laser beam is utilized to irradiate a localized portion of a thin-film lead made from an oxygen-containing superconducting material. Laser-induced heating of the localized portion causes oxygen to be emitted from the material. The degree of oxygen removal in the laser-modified portion is controlled to achieve a semiconducting or semiconducting-like material that does not show any evidence of superconductivity and that exhibits the properties of a photoconductive detector. Such a detector is disposed in intimate contact with unmodified superconducting regions of the thin-film lead. These regions serve as electrical interconnects for the detector.

BRIEF DESCRIPTION OF THE DRAWING

A complete understanding of the present invention and of the above and other features thereof will be apparent from a consideration of the detailed description below taken in conjunction with the accompanying drawing, not drawn to scale, in which.

DETAILED DESCRIPTION

The principles of this invention are applicable to a variety of high-critical-temperature oxygen-containing superconductors. Herein, for purposes of a specific illustrative example, emphases will be mainly directed to the conventional superconducting material known as $YBa_2Cu_3O_7$. Other standard oxygen-containing superconductors such as the La-Cu-O, Tl-Ba-Ca-Cu-O, Bi-Sr-Ca-Cu-O, and RE-Ba-Cu-O systems, where RE is a rare earth that could be substituted for Y, are also suitable for forming thin films from which a microelectronic assembly of the type described below can be formed.

Figure 1:
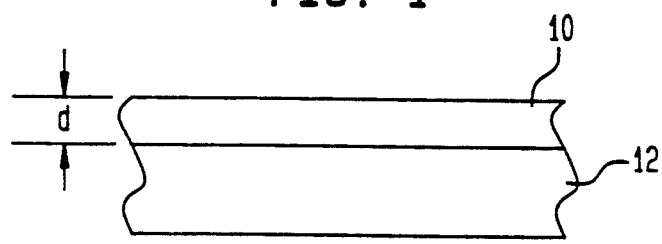
FIG. 1 is a side-view representation of a superconducting thin film formed on a substrate.

In accordance with the invention, a superconducting thin film 10 is prepared on the entire top surface of a substrate 12, as represented in FIG. 1. By way of example, the substrate 12 comprises (110) or (001) $SrTiO_3$ or (001) $LaAlO_3$. The latter is usually preferred for high speed applications since it does not exhibit the relatively large dielectric constant of $SrTiO_3$. Other substrate materials such as silicon may be suitable if appropriate buffer layers (not shown) are interposed between the substrate 12 and the thin film 10 to prevent deleterious high-temperature reactions therebetween.

Illustratively, a thin film 10 of $YBa_2Cu_3O_7$ is prepared on the substrate 12 of FIG. 1 by co-evaporation of Y, $BaF_2$ and Cu in the presence of $O_2$. (Alternatively, a thin film of this material can be formed by pulsed laser deposition.) Subsequently, to remove the fluorine constituent from the deposited material, the film 10 is annealed at about 850 degrees Celsius for approximately 30 minutes in oxygen with an $H_2O$ partial pressure of about 0.02 atmosphere. The thickness of the film 10 prepared in this manner is typically less than about one micrometer (for example, in the range of 0.1-to-1 micrometer).

Figure 2:
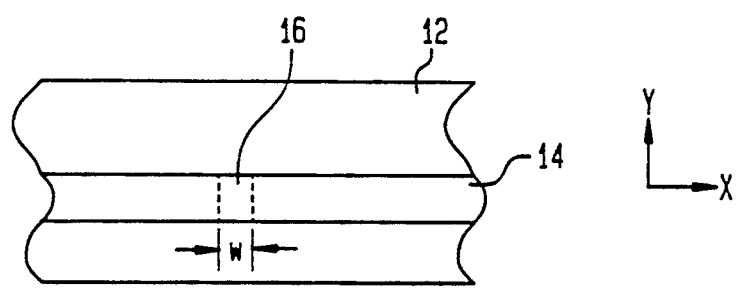
FIG. 2 is a top view of a specific illustrative assembly made in accordance with the principles of the present invention.

The superconducting thin film 10 of FIG. 1 is then processed to remove all but an elongated portion thereof from the top surface of the substrate 12. As shown in FIG. 2, the portion 14 of the thin film remaining on the substrate 12 comprises an elongated portion that constitutes a superconducting lead. Illustratively, the Y-direction extent of the lead 14 is about 10-to-50 micrometers.

Patterning of the thin film 10 of FIG. 1 to form the superconducting lead 14 of FIG. 2 is done, for example, utilizing standard photolithographic techniques, followed by wet etching with a one-volume-percent solution of $HNO_3$. Alternatively, the superconducting lead 14 is patterned from the originally deposited thin film 10 by conventional ion milling.

In accordance with the invention, the entire lateral or Y-direction extent of a relatively narrow X-direction region of the superconducting lead 14 of FIG. 2 is then irradiated. The irradiated region of the lead 14 is contained between the dash lines in FIG. 2 and is designated therein by reference numeral 16. By way of example, the width w of the irradiated region 16 is about 3 micrometers.

Illustratively, the region 16 of FIG. 2 is irradiated and thereby modified by directing thereat a focused laser beam. Thus, for example, the region 16 can be modified by utilizing a conventional scanning system that includes an $Ar^+$ laser tuned to 514.5 nanometers and focused to a spot having a diameter of 2 micrometers (50x, 0.60 NA). The laser beam is advantageously directed into a vacuum chamber where the film-containing substrate to be irradiated is mounted on a conventional set of computer-controlled translation stages. Illustratively, the lateral (Y direction) scanning rate is about 10 micrometers per second. The vacuum chamber is, for example, evacuated to approximately one millitorr, and typical incident laser power levels are less than about 60 milliwatts.

Laser irradiation of the region 16 of FIG. 2 causes localized heating thereof. As a result, oxygen contained in the superconducting material of the region 16 is released into the vacuum chamber. The degree of such modification of the structure of the superconducting material in the region 16 can be monitored and controlled by measuring the room-temperature electrical resistance of the lead 14 during laser irradiation. Such a measure indicates in effect the amount of oxygen removed from the region 16. In practice, the resistance of the modified region 16 is typically increased several orders of magnitude and the region is made semiconducting. The sections of the lead 14 that are not irradiated are not modified.

Due to laser irradiation, sufficient oxygen is removed from the region 16 (FIG. 2) to convert it from a superconducting material to a superconducting material with a reduced transition temperature and then to a region that exhibits semiconducting or semiconducting-like behavior with no evidence of a superconducting transition. In other words, the irradiated region loses its superconducting properties and is converted to an oxygen-deficient semiconducting or semiconducting-like region that lies in intimate contact with the remaining unmodified portions of the superconducting lead 14.

Illustratively, for the superconducting material $YBa_2Cu_3O_7$, laser irradiation causes the material in the region 16 to be converted to $YBa_2Cu_3O_{6+x}$, where x is less than the value that will cause the region to be superconducting. In particular, to achieve a semiconducting or semiconducting-like characteristic, the value of x in the region 16 should advantageously be in the range of approximately 0 to 0.4.

Significantly, the region 16 of FIG. 2 modified in the specific manner detailed above exhibits a photo-responsive characteristics. In response to incident light directed at some part or all of the surface area of the region 16, the region 16 generates carriers and thus provides an electrical current flow in the associated contacting portions of the lead 14. Hence, the region functions as a photoconductor capable of detecting input light signals and converting them in effect into electrical signals that propagate in the leads connected to the region 16. For operation below the critical temperature of $YBa_2Cu_3O_7$, these leads constitute superconducting interconnects for the photodetector formed in the region 16. In turn, these interconnects can extend to other components (not shown) of a microminiature electronic assembly formed on the substrate 12.

Laser irradiation of the region 16 of FIG. 2 need not occur in a vacuum. It should, however, advantageously occur in a non-oxygen-containing ambient. Otherwise, the temperature to which the region 16 must be raised to release oxygen therefrom may cause melting or other deleterious effects in the region. An example of a suitable alternative ambient is pressurized nitrogen.

Also, in accordance with this invention, various forms of irradiation other than a laser beam can be utilized to modify a region of the aforespecified superconducting material to render it photoconductive. Thus, for example, beams of ions, electrons or neutrons are also effective to achieve the desired modification. Or the modification may be achieved by masking all of the lead 14 (FIG. 2) except for the region 16 with a highly reflective masking material and then intensely flood lighting the masked structure to heat up and release oxygen only from the unmasked region 16.

Finally, it is to be understood that the various specific arrangements and techniques described herein are only illustrative of the application of the principles of the present invention. In accordance with these principles, numerous alternatives and modifications may easily be made by those skilled in the art without departing from the spirit and scope of the invention.

What is claimed is:

1. A method of fabricating a microelectronic assembly comprising a photoconducting device comprising the steps of
   depositing an elongated electrical lead comprising an oxide superconducting material on the top surface of a substrate,
   and irradiating the entire lateral width of a portion of said lead to destroy the superconducting property of said portion and to render said portion photoconductive.

2. A method as in claim 1 wherein, in said irradiating step sufficient, oxygen is removed from said portion to cause said portion to exhibit a semiconducting property.

3. A method as in claim 2 wherein said irradiating step comprises directing a focused laser beam at said portion.

4. A method as in claim 3 wherein said superconducting material comprises $YBa_2Cu_3O_7$.

5. A method as in claim 4 wherein said portion is converted by said irradiation to $YBa_2Cu_3O_{6+x}$, where x has a value between 0 and 0.4.

6. The method of fabricating a photoconductor device having integrated superconducting leads comprising the steps of
   depositing a continuous elongated film of an oxide superconducting material on the top surface of a substrate, said elongated film having two end portions and an interposed central portion, and
   irradiating the central portion to destroy the superconducting property of the central portion and render that central portion photoconductive.

7. A method of fabricating a photoconductor device having integrated superconducting leads comprising the steps of:
   depositing a continuous elongated film of an oxide superconducting material on the top surface of a substrate, said elongated film having two end portions and an interposed central portion,
   depleting the oxygen content of the central portion to convert the central portion from a superconducting material to a semiconductor exhibiting photoconductive property.

* * * * *